(12) United States Patent
Kang et al.

(10) Patent No.: US 12,166,101 B2
(45) Date of Patent: Dec. 10, 2024

(54) HIGH-ELECTRON-MOBILITY TRANSISTOR DEVICE AND METHOD OF MANUFACTURING THE SAME

(71) Applicant: ELECTRONICS AND TELECOMMUNICATIONS RESEARCH INSTITUTE, Daejeon (KR)

(72) Inventors: Soo Cheol Kang, Daejeon (KR); Hyun Wook Jung, Daejeon (KR); Seong IL Kim, Daejeon (KR); Hae Cheon Kim, Daejeon (KR); Youn Sub Noh, Daejeon (KR); Ho Kyun Ahn, Daejeon (KR); Sang Heung Lee, Daejeon (KR); Jong Won Lim, Daejeon (KR); Sung Jae Chang, Daejeon (KR); Il Gyu Choi, Daejeon (KR)

(73) Assignee: ELECTRONICS AND TELECOMMINICATIONS RESEARCH INSTITUTE, Daejeon (KR)

( * ) Notice: Subject to any disclaimer, the term of this patent is extended or adjusted under 35 U.S.C. 154(b) by 399 days.

(21) Appl. No.: 17/671,171

(22) Filed: Feb. 14, 2022

(65) Prior Publication Data

US 2022/0262922 A1    Aug. 18, 2022

(30) Foreign Application Priority Data

Feb. 15, 2021 (KR) .................. 10-2021-0019933
Feb. 7, 2022 (KR) .................. 10-2022-0015641

(51) Int. Cl.
*H01L 29/66* (2006.01)
*H01L 29/778* (2006.01)

(52) U.S. Cl.
CPC .... *H01L 29/66431* (2013.01); *H01L 29/7786* (2013.01)

(58) Field of Classification Search
CPC ........... H01L 29/66431; H01L 29/7786; H01L 29/0843; H01L 29/2003; H01L 29/41725; H01L 29/66462
See application file for complete search history.

(56) References Cited

U.S. PATENT DOCUMENTS 8,035,130 B2 * 10/2011 Nanjo .................. H01L 29/802
                                                                257/E29.252
8,362,924 B2    1/2013 Kim et al.
(Continued)

FOREIGN PATENT DOCUMENTS

JP    2009-117712 A    5/2009
JP    2019-125600 A    7/2019
(Continued)

*Primary Examiner* — Kyoung Lee
*Assistant Examiner* — Sophia W Kao

(57) ABSTRACT

A method of manufacturing a high-electron-mobility transistor device is provided. The method includes sequentially forming a transition layer and a semiconductor layer on a substrate, etching a portion of a surface of the semiconductor layer to form a barrier layer region having a certain depth and forming a barrier layer in the barrier layer region, forming a source electrode and a drain electrode on a 2-dimensional electron gas (2-DEG) layer upward exposed at a surface of the semiconductor layer, in defining the 2-DEG layer formed along an interface between the semiconductor layer and the barrier layer, forming a passivation layer on the semiconductor layer, the barrier layer, the source electrode, and the drain electrode and etching a portion of the passivation layer to upward expose the source electrode, the drain electrode, and the barrier layer, and forming a gate electrode on the upward exposed barrier layer.

4 Claims, 5 Drawing Sheets

(56) References Cited

U.S. PATENT DOCUMENTS

| | | | |
|---|---|---|---|
| 9,147,761 B2 * | 9/2015 | Kikkawa | H01L 29/205 |
| 10,665,708 B2 * | 5/2020 | Radosavljevic | H01L 21/02513 |
| 2016/0126339 A1 * | 5/2016 | Lee | H01L 29/66462 |
| | | | 257/194 |
| 2019/0378405 A1 | 12/2019 | Lee | |

FOREIGN PATENT DOCUMENTS

| | | |
|---|---|---|
| JP | 2019-145605 A | 8/2019 |
| KR | 10-2015-0017740 A | 2/2015 |
| KR | 10-1734336 B1 | 5/2017 |
| KR | 10-2018-0008431 A | 1/2018 |
| KR | 10-2018-0053207 A | 5/2018 |
| KR | 10-2018-0059334 A | 6/2018 |
| KR | 10-2019-0027700 A | 3/2019 |
| KR | 10-2133367 | 7/2020 |
| KR | 10-2247674 | 5/2021 |
| KR | 10-2022-0013871 A | 2/2022 |
| WO | 2016/186654 A1 | 11/2016 |

\* cited by examiner

HIGH-ELECTRON-MOBILITY TRANSISTOR DEVICE AND METHOD OF MANUFACTURING THE SAME

CROSS-REFERENCE TO RELATED APPLICATIONS

This application claims the benefit of the Korean Patent Application No. 10-2021-0019933 filed on Feb. 15, 2021 and the Korean Patent Application No. 10-2022-0015641 filed on Feb. 7, 2022, which is hereby incorporated by reference as if fully set forth herein.

BACKGROUND

Field of the Invention

The present invention relates to a semiconductor device, and more particularly, to a high-electron-mobility transistor (HEMT).

Discussion of the Related Art

High-electron-mobility transistors (HEMTs) have a hetero semiconductor junction structure having different energy band gaps.

Based on band discontinuity occurring due to a band gap difference between semiconductors and polarization caused by the hetero semiconductor junction structure, a 2-dimensional electron gas (2-DEG) layer is formed in a heterojunction interface and is used as a channel layer of a semiconductor device.

A concentration of electrons in the 2-DEG layer depends on electrical charges which are in a semiconductor layer, a barrier layer, and inner portions and an interface of dielectric films formed on the barrier layer, in addition to band discontinuity and polarization between hetero joined semiconductor materials, and a concentration of electrons affects an electrical characteristic of a device.

Electrons generated in the 2-DEG layer move between a source electrode and a drain electrode and are controlled by a voltage applied to the source electrode, the drain electrode, and a gate electrode. HEMT devices using the 2-DEG layer are attracting much attention as next-generation power devices, on the basis of a high frequency characteristic, a high power density, and a large breakdown voltage characteristic, but characteristics of devices such as a current characteristic and a frequency characteristic may be limited by a resistance caused by a condition for forming the source electrode and the drain electrode.

SUMMARY

Accordingly, the present invention provides an HEMT and a method of manufacturing the same, in which a resistance occurring in a source electrode and a drain electrode is reduced and a frequency characteristic is improved.

The present invention also provides an HEMT having an enhanced electrical characteristic and a method of manufacturing the same.

The objects of the present invention are not limited to the aforesaid, but other objects not described herein will be clearly understood by those skilled in the art from descriptions below.

In one general aspect, a method of manufacturing a high-electron-mobility transistor device includes: sequentially forming a transition layer and a semiconductor layer on a substrate; etching a portion of a surface of the semiconductor layer to form a barrier layer region having a certain depth and forming a barrier layer in the barrier layer region; forming a source electrode and a drain electrode on a 2-dimensional electron gas (2-DEG) layer upward exposed at a surface of the semiconductor layer, in defining the 2-DEG layer formed along an interface between the semiconductor layer and the barrier layer; forming a passivation layer on the semiconductor layer, the barrier layer, the source electrode, and the drain electrode and etching a portion of the passivation layer to upward expose the source electrode, the drain electrode, and the barrier layer; and forming a gate electrode on the upward exposed barrier layer.

In an embodiment, the forming of the source electrode and the drain electrode on the 2-DEG layer may include directly and electrically connecting the 2-DEG layer to the source electrode and the drain electrode.

In an embodiment, the forming of the source electrode and the drain electrode on the 2-DEG layer may include respectively forming the source electrode and the drain electrode on both end portions of the 2-DEG layer upward exposed at the surface of the semiconductor layer.

In an embodiment, the forming of the source electrode and the drain electrode on the 2-DEG layer may include: respectively forming a first metal pattern and a second metal pattern on both end portions of the 2-DEG layer upward exposed at the surface of the semiconductor layer; diffusing the formed first and second metal patterns into the semiconductor layer and the barrier layer through a rapid thermal process; and forming the first and second metal patterns, diffused into the semiconductor layer and the barrier layer, as the source electrode and the drain electrode.

In another general aspect, a method of manufacturing a high-electron-mobility transistor device includes: sequentially forming a transition layer and a first semiconductor layer on a substrate; forming a barrier layer on a front surface of the first semiconductor layer; removing a portion of the barrier layer and forming a second semiconductor layer on the first semiconductor layer upward exposed by the removal of the portion of the barrier layer; respectively forming a source electrode and a drain electrode on both end portions of a 2-dimensional electron gas (2-DEG) layer upward exposed at a surface of a semiconductor layer including the first semiconductor layer and the second semiconductor layer formed on the first semiconductor layer, in defining the 2-DEG layer formed along an interface between the semiconductor layer and the barrier layer; forming a passivation layer on the semiconductor layer, the barrier layer, the source electrode, and the drain electrode and etching a portion of the passivation layer to upward expose the source electrode, the drain electrode, and the barrier layer; and forming a gate electrode on the upward exposed barrier layer.

In an embodiment, the respectively forming of the source electrode and the drain electrode on the both end portions of the 2-DEG layer may include directly and electrically connecting the both end portions of the 2-DEG layer to the source electrode and the drain electrode, respectively.

In an embodiment, the respectively forming of the source electrode and the drain electrode on the both end portions of the 2-DEG layer may include: respectively forming a first metal pattern and a second metal pattern on the both end portions of the 2-DEG layer; diffusing the formed first and second metal patterns into the semiconductor layer and the barrier layer through a rapid thermal process; and forming the first and second metal patterns, diffused into the semiconductor layer and the barrier layer, as the source electrode and the drain electrode.

In an embodiment, the first semiconductor layer and the second semiconductor layer may include the same material and different materials.

In another general aspect, a high-electron-mobility transistor device includes: a transition layer stacked on a substrate; a semiconductor layer stacked on the transition layer; a barrier layer stacked in a groove formed by a certain depth in a surface of the semiconductor layer; a source electrode and a drain electrode stacked on both end portions of a 2-dimensional electron gas (2-DEG) layer upward exposed at the surface of the semiconductor layer, in defining the 2-DEG layer formed along an interface between the semiconductor layer and the barrier layer; a passivation layer stacked on the semiconductor layer and the barrier layer, the passivation layer including an opening portion upward exposing the source electrode, the drain electrode, and a portion of the barrier layer between the source electrode and the drain electrode; and a gate electrode stacked on a portion of the upward exposed barrier layer.

In an embodiment, the both end portions of the 2-DEG layer may be electrically and directly connected to the source electrode and the drain electrode, respectively.

In an embodiment, the both end portions of the 2-DEG layer may have a bent shape to be upward exposed at the surface of the semiconductor layer.

In an embodiment, the semiconductor layer may include: a first semiconductor layer stacked on the transition layer; and a second semiconductor layer stacked on the first semiconductor layer, the second semiconductor layer including the groove where the barrier layer is stacked.

In an embodiment, the 2-DEG layer may be formed in a horizontal direction in the first semiconductor layer and may be formed in a vertical direction in the second semiconductor layer.

Other features and aspects will be apparent from the following detailed description, the drawings, and the claims.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
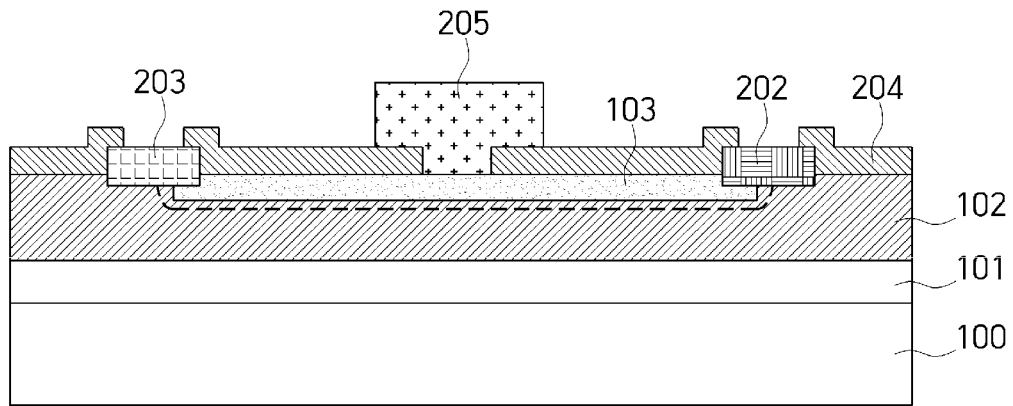
FIG. 1 is a cross-sectional view for describing a semiconductor device according to an embodiment of the present invention.

Hereinafter, an HEMT device and a method of manufacturing the same according to embodiments of the present invention will be described in detail with reference to the accompanying drawings. Widths and thicknesses of layers or regions illustrated in the accompanying drawings are exaggeratedly illustrated for clarity. In a detailed description, like reference numerals refer to like elements.

Herein, a process of forming a first feature portion on or over a second feature portion may include embodiments where the first and second feature portions are formed to directly contact each other, and moreover, may include embodiments where additional feature portions are formed between the first and second feature portions so that the first and second feature portions do not directly contact each other.

FIG. 1 is a cross-sectional view for describing a semiconductor device according to an embodiment of the present invention.

Referring to FIG. 1, the semiconductor device (hereinafter referred to as an HEMT device) may include a substrate 100, a transition layer 101, a semiconductor layer 102, a barrier layer 103, a drain electrode 202, a source electrode 203, a passivation layer 204, and a gate electrode 205.

The substrate 100 may be, for example, a silicon carbide (SiC) substrate, a silicon (Si) substrate, a gallium nitride (GaN) substrate, a sapphire substrate, or a diamond substrate, but is not limited thereto.

The transition layer 101 may be stacked (disposed) on the substrate 100. The transition layer 101 may function as a buffer layer for reducing a lattice constant and a thermal expansion coefficient difference between the substrate 100 and the semiconductor layer 102. In the drawing, the transition layer 101 having a single-layer structure is illustrated, but is not limited thereto and may have a multi-layer structure.

The semiconductor layer 102 may be stacked (disposed) on the transition layer 101. A groove or a region (10 of FIG. 2B) having a certain depth may be formed in a surface of the semiconductor layer 102. The barrier layer 103 may be stacked (disposed) in the groove or the region. The semiconductor layer 102 may have a thickness of tens µM or less, and for example, may include one or more of Group III-V compound semiconductors including AlN, InN, GaN, AlGaN, InGaN, AlInN, AlGaInN, and GaAs. A material of the 2-DEG layer capable of being formed in the semiconductor layer 102 is not limited and may be used as a material of the semiconductor layer 102.

When the barrier layer 103 is stacked (disposed) in the groove or the region formed in the surface of the semiconductor layer 102, a 2-DEG layer 102A formed along an interface between the semiconductor layer 102 and the barrier layer 103 may be defined in the semiconductor layer 102. In this case, both end portions of the 2-DEG layer 102A may be formed to have a bent shape so as to be exposed at the surface of the semiconductor layer 102.

The drain electrode 202 and the source electrode 203 may be stacked (disposed) on a junction boundary between the semiconductor layer 102 and the barrier layer 103 so as to be electrically connected to the both end portions of the 2-DEG layer 102A.

The passivation layer 204 may be stacked on the semiconductor layer 102 and the barrier layer 103, which are exposed upward. Also, opening portions which upward expose the drain electrode 202, the source electrode 203, and a portion of the barrier layer 103 between the drain electrode 202 and the source electrode 203 may be formed in the passivation layer 204. A bias voltage may be applied to the drain electrode 202 and the source electrode 203 upward exposed by the opening portions.

The gate electrode 205 may be stacked (disposed) on the barrier layer 103 upward exposed by the opening portion (2$k$ of FIG. 2O) formed in the passivation layer 204.

Hereinafter, a method of manufacturing the semiconductor device (or the HEMT device) illustrated in FIG. 1 will be described in detail.

FIGS. 2A to 2L are cross-sectional views for describing a method of manufacturing a semiconductor device according to an embodiment of the present invention.

Figure 2A:
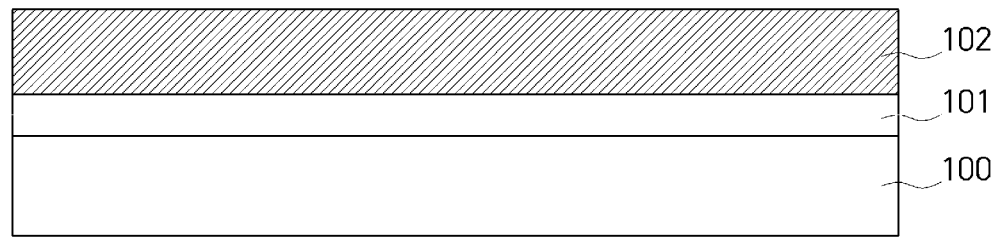
FIGS. 2A to 2L are cross-sectional views for describing a method of manufacturing a semiconductor device according to an embodiment of the present invention.

First, referring to FIG. 2A, the substrate 100 may be prepared. The transition layer 101 may be formed on the substrate 100 by a known deposition process including an epitaxial growth process. The semiconductor layer 102 may be formed on the transition layer 101 by the known deposition process.

Figure 2B:
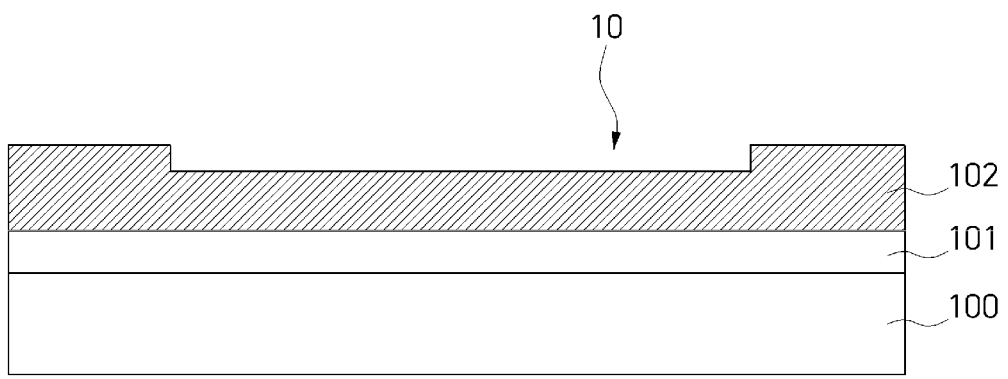

Subsequently, referring to FIG. 2B, a barrier layer region 10 having a certain depth may be formed through an etching process of removing a portion of a surface of the semiconductor layer 102. Herein, the barrier layer region 10 may be referred to as a groove or an etch groove. The etching process may include, for example, a dry etching process, a wet etching process, or a combination thereof. A structure of the barrier layer region 10 may have various shapes.

Subsequently, referring to FIG. 2B, the barrier layer 103 may be formed in the barrier layer region (10 of FIG. 2B) formed in the surface of the semiconductor layer 102. A known deposition process may be used for forming the barrier layer 103.

Figure 2C:
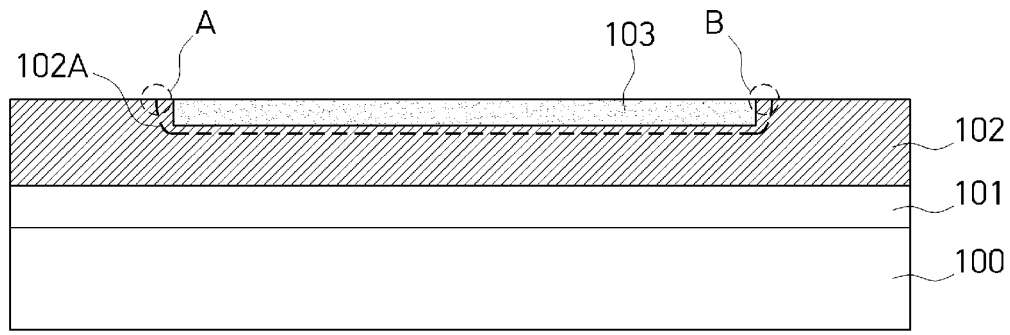
Figure 2D:
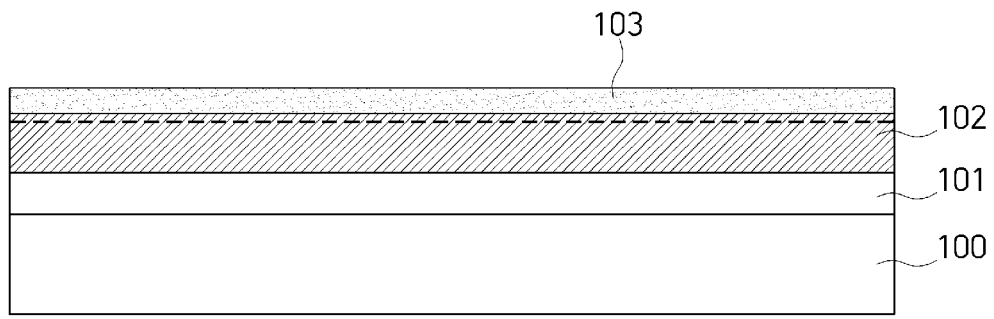
Figure 2E:
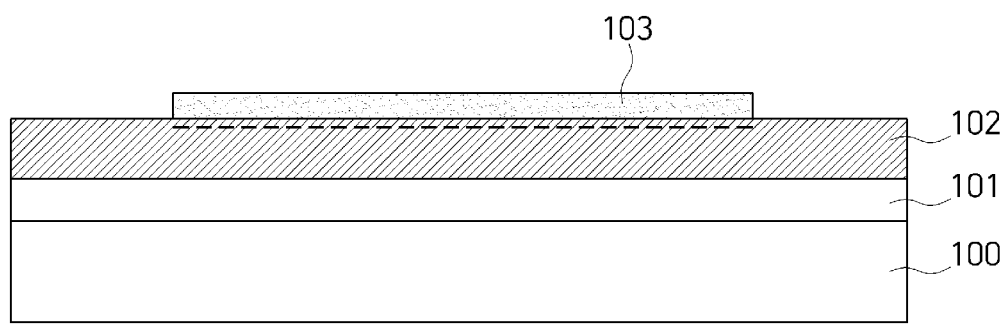
Figure 2F:
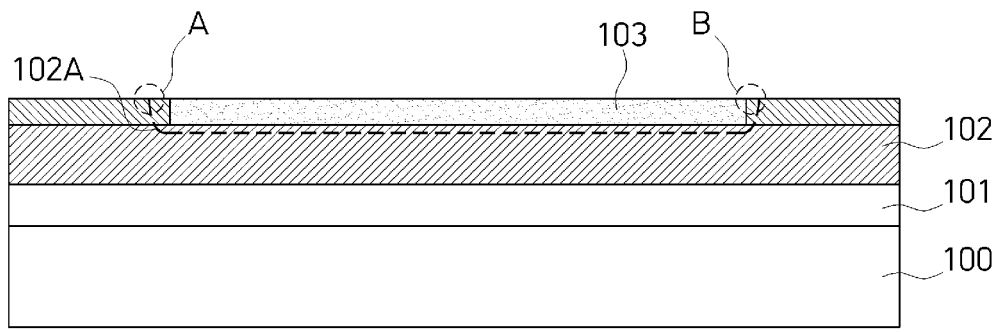

FIGS. 2D to 2F illustrates another example which forms the barrier layer 103 in the surface of the semiconductor layer 102. First, referring to FIG. 2D, the barrier layer 103 may be formed (stacked) on the whole surface of the semiconductor layer 102 (a first semiconductor layer).

Subsequently, referring to FIG. 2E, an etching process of removing a portion of the barrier layer 103 formed on the surface of the semiconductor layer 102 may be performed. The etching process may include, for example, a dry etching process, a wet etching process, or a combination thereof.

Subsequently, referring to FIG. 2F, a second semiconductor layer 104 may be formed on the surface of the semiconductor layer 102 upward exposed by the etching process of FIG. 2E. In a case where two semiconductor layers 102 and 104 are stacked in this manner, a 2-DEG layer 102A may be formed in a horizontal direction in the first semiconductor layer 102 and may be formed in a vertical direction in the second semiconductor layer 104. Accordingly, both ends A and B of the 2-DEG layer 102A may be exposed in an upward direction at a surface of the second semiconductor layer 104.

The second semiconductor layer 104 may have a thickness of tens μM or less, and for example, may include one or more of Group III-V compound semiconductors including AlN, InN, GaN, AlGaN, InGaN, AlInN, AlGaInN, and GaAs, but the present invention is not limited thereto. In another embodiment, a material of the 2-DEG layer capable of being formed in the second semiconductor layer 104 contacting the barrier layer 103 is not limited and may be used as a material of the second semiconductor layer 104. A material of the semiconductor layer 102 (or the first semiconductor layer) may be the same as or different from a material of the second semiconductor layer 104.

Figure 2G:
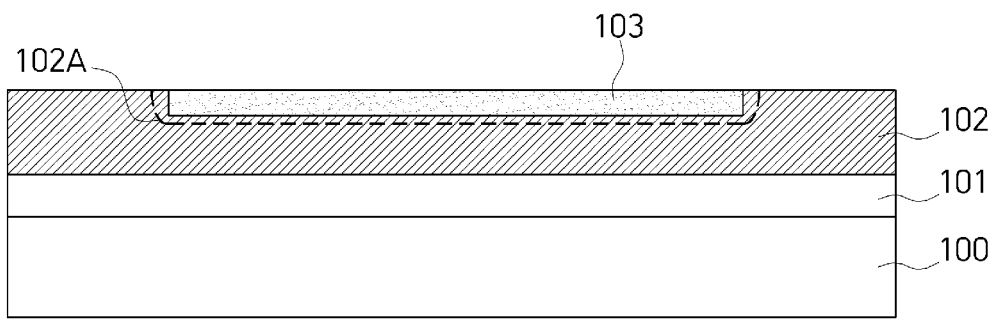

Referring to FIGS. 2C, 2F, and 2G, a heterojunction may be formed in an interface between the semiconductor layer 102 and the barrier layer 103, and the 2-DEG layer 102A may be defined in the semiconductor layer 102 by the heterojunction. In an operation, the 2-DEG layer 102A may function as a conductive channel.

The 2-DEG layer 102A may be formed along the interface between the semiconductor layer 102 and the barrier layer 103, and in this case, the both end portions A and B of the 2-DEG layer 102A may have a bent shape. Accordingly, the 2-DEG layer 102A may extend to the surface of the semiconductor layer 102, and the both end portions A and B of the 2-DEG layer 102A may be exposed at the surface of the semiconductor layer 102.

The semiconductor layer 102 may be an undoped layer, but depending on the case, may be a layer doped with a small amount of impurities. The barrier layer 103 may include, for example, at least one of aluminum (Al), gallium (Ga), indium (In), and boron (B) among nitrides and may have a single-layer or multi-layer structure for increasing a concentration of electrons of the 2-DEG layer. For example, the barrier layer 103 may be formed in a single-layer or multi-layer structure which includes one or more of various nitrides consisting of InGaN, AlGaN, AlInGaN, AlInN, and AlN.

A thickness of the barrier layer 103 may be tens nm or less, and the barrier layer 103 may be a layer to which a small amount of impurities are added or may be a layer to which impurities are not added. The semiconductor layer 102 and the barrier layer 103 may include semiconductor materials having different lattice constants, and the barrier layer 103 may have a band gap which is wider than that of the semiconductor layer 102.

The 2-DEG layer 102A may be formed in the semiconductor layer 102 on the basis of band discontinuity occurring in an energy band gap and polarization occurring in an interface in hetero joining the semiconductor layer 102 to the barrier layer 103. The 2-DEG layer 102A may be directly and electrically connected to the source electrode and the drain electrode in the HEMT device and may be used as a channel (or a channel layer) through which electrons move.

Although not shown in the drawing, an interface layer may be further disposed between the semiconductor layer 102 and the barrier layer 103. The interface layer may improve an interface characteristic of the semiconductor layer 102 and the barrier layer 103 to enhance an electron concentration and an electron mobility of the 2-DEG layer 102A. The interface layer may include a material such as AlN of several nm or less.

Figure 2H:
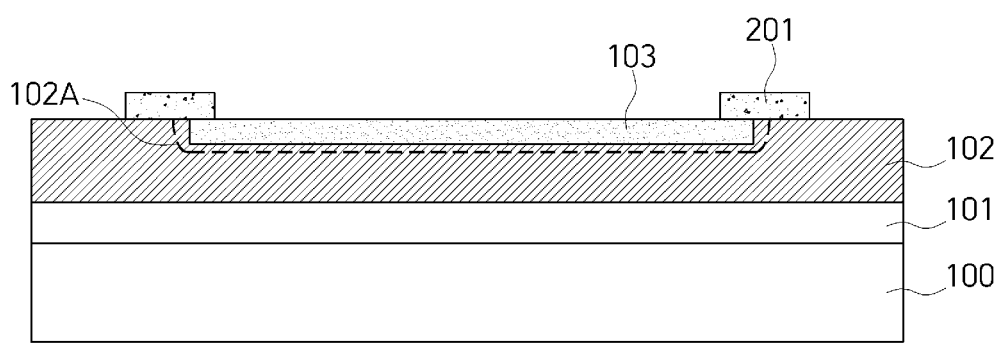

Subsequently, referring to FIG. 2H, metal patterns 201 having conductivity may be formed (patterned or deposited) on the semiconductor layer 102, the barrier layer 103, and the 2-DEG layer 102A exposed at the surface of the semiconductor layer 102. Accordingly, the 2-DEG layer 102A may be electrically and directly connected to the metal patterns 201.

The metal patterns 201 may be used as the drain electrode 202 and the source electrode 203 illustrated in FIG. 1, on the basis of positions thereof. The metal patterns 201 may include, for example, titanium (Ti), aluminum (Al), nickel (Ni), gold (Au), palladium (Pd), copper (Cu), cobalt (Co), platinum (Pt), or alloy thereof. A thickness of the metal patterns 201 deposited may be several nm to several μm.

A method of forming the metal patterns 201 may use a photolithography process, a metal deposition process, and a liftoff process. Such processes may be processes widely known to those skilled in the art, and their detailed description may be replaced by known technology.

Figure 2I:
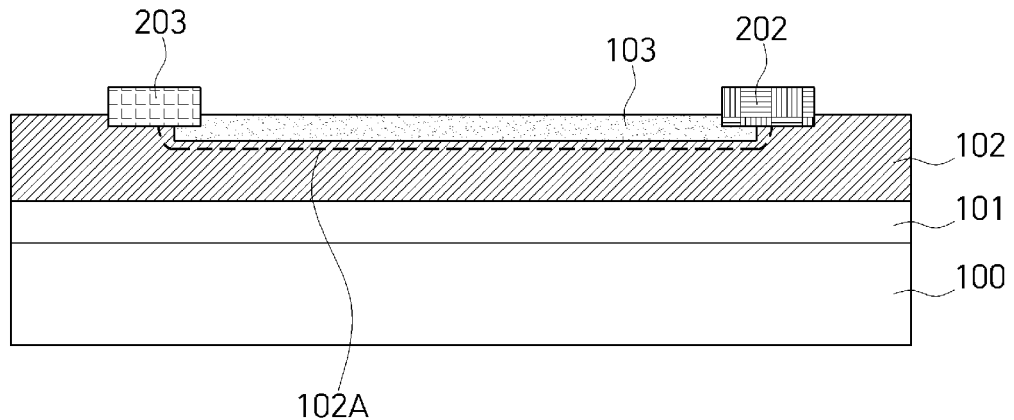

Subsequently, referring to FIG. 2I, a process of diffusing the metal patterns 201, formed on the semiconductor layer 102, the barrier layer 103, and the 2-DEG layer 102A exposed at the surface of the semiconductor layer 102, into the barrier layer 103 and the semiconductor layer 102 may be performed through a rapid thermal process (RTP). The metal patterns 201 diffused into the barrier layer 103 and the semiconductor layer 102 may be respectively formed as the drain electrode 202 (a drain region) and the source electrode 203 (a source region).

The metal patterns 201 may form an ohmic contact and may be diffused into the semiconductor layer 102 and the barrier layer 103, and under such a condition, the RTP is not limited. The drain electrode 202 and the source electrode 203 may form an ohmic contact alloy through the RTP, and the RTP may be performed in a vacuum atmosphere of 1,100 degrees C. (for example, 850 degrees C.) for 30 seconds. Although not shown, after the drain electrode 202 and the source electrode 203 are formed, device isolation may be performed by using an ion implantation process or an etching process. Additionally, after the drain electrode 202 and the source electrode 203 are formed, a thermal treatment process may not be performed based on a level of a resistance.

Figure 2J:
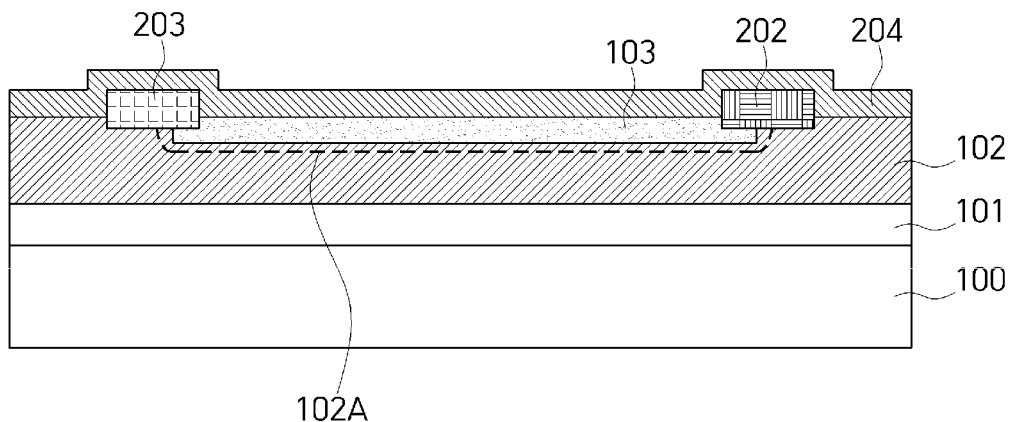

Subsequently, referring to FIG. 2J, a process of depositing the passivation layer 204 on the semiconductor layer 102, the drain electrode 202, the source electrode 203, and the barrier layer 103 formed between the drain electrode 202 and the source electrode 203 may be performed.

The passivation layer 204 may have a single-layer or multi-layer structure including one or more of SiO, SiN, and a dielectric having a high dielectric constant. The deposition process may be one of a physical vapor deposition (PVD) process, a pulsed laser deposition (PLD) process, a chemical vapor deposition (CVD) process, and an atomic layer deposition (ALD) process, or may be a combination thereof.

Figure 2K:
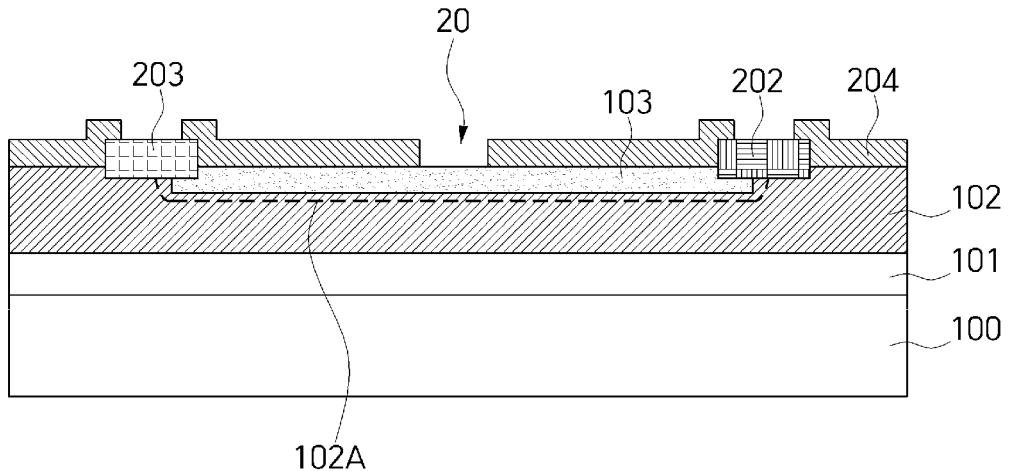

Subsequently, referring to FIG. 2K, in order to apply a bias voltage to the drain electrode 202 and the source electrode 203, a process of etching the passivation layer 204 formed on the drain electrode 202 and the source electrode 203 to form an opening portion 20 upward exposing a surface of each of the drain electrode 202 and the source electrode 203 may be performed. Simultaneously, a process of removing a portion of the passivation layer 204 formed between the drain electrode 202 and the source electrode 203 to form the opening portion 20 for upward exposing the barrier layer 103 may be performed. The gate electrode 205 described below may be formed on the upward exposed barrier layer 103.

An etching process for forming the opening portions may be, for example, a dry etching process, a wet etching process, or a combination thereof. An etched area and thickness of the passivation layer 204 for forming the gate electrode 205 may be hundreds μM or less.

Figure 2L:
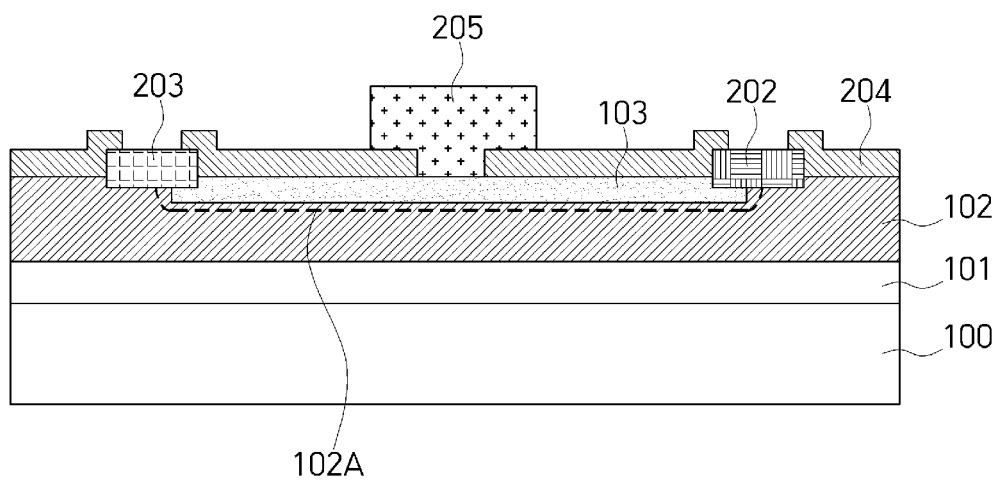

Subsequently, referring to FIG. 2L, the gate electrode 205 may be formed on the upward exposed barrier layer 103. The gate electrode 205 may include Ti, Al, Ni, Au, Pd, Cu, Co, Pt, or an alloy thereof. The gate electrode 205 may be formed in a T-shape or a F-shape where a width of an upper portion thereof is greater than a width of a lower portion thereof, in order to reduce a resistance. Accordingly, the gate electrode 205 may be formed all over a surface of the passivation layer 204 and the barrier layer 103 upward exposed by the opening portion (20 of FIG. 2K) formed in the passivation layer 204.

The gate electrode 205 may be formed by using a photolithography process and/or an electron beam lithography process, and after a wiring pattern is formed, by using an electron beam evaporator, a multi-layer metal including Ni or Pt may be deposited and a liftoff process may be performed.

In the HEMT according to the embodiments of the present invention, a 2-DEG layer may be naturally formed near an interface between a semiconductor layer and a barrier layer on the basis of an energy band gap difference and polarization occurring due to a junction of the semiconductor layer and the barrier layer. Electrons in the 2-DEG layer may move based on a voltage applied to a source electrode, a drain electrode, and a gate electrode. However, a resistance occurring based on a condition for forming the source electrode and the drain electrode may limit the movement of the electrons, and due to this, a current may be reduced, causing a degradation in frequency characteristic.

In the HEMT device according to the embodiments of the present invention, the barrier layer may be formed on the semiconductor layer so that the 2-DEG layer is exposed at a surface of the semiconductor layer, and the source electrode and the drain electrode may be formed on the 2-DEG layer exposed at the surface of the semiconductor layer. Accordingly, the 2-DEG layer may be connected to the source electrode and the drain electrode, and thus, a resistance may be minimized and a frequency characteristic of the HEMT device may be enhanced.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of manufacturing a high-electron-mobility transistor device, the method comprising:
    sequentially forming a transition layer and a semiconductor layer on a substrate;
    etching a portion of a surface of the semiconductor layer to form a barrier layer region having a certain depth and forming a barrier layer in the barrier layer region;
    forming a source electrode and a drain electrode on a 2-dimensional electron gas (2-DEG) layer upward exposed at a surface of the semiconductor layer, in defining the 2-DEG layer formed along an interface between the semiconductor layer and the barrier layer;
    forming a passivation layer on the semiconductor layer, the barrier layer, the source electrode, and the drain electrode and etching a portion of the passivation layer to upward expose the source electrode, the drain electrode, and the barrier layer; and
    forming a gate electrode on the upward exposed barrier layer.

2. The method of claim 1, wherein the forming of the source electrode and the drain electrode on the 2-DEG layer comprises directly and electrically connecting the 2-DEG layer to the source electrode and the drain electrode.

3. The method of claim 1, wherein the forming of the source electrode and the drain electrode on the 2-DEG layer comprises respectively forming the source electrode and the drain electrode on both end portions of the 2-DEG layer upward exposed at the surface of the semiconductor layer.

4. The method of claim 1, wherein the forming of the source electrode and the drain electrode on the 2-DEG layer comprises:
    respectively forming a first metal pattern and a second metal pattern on both end portions of the 2-DEG layer upward exposed at the surface of the semiconductor layer;
    diffusing the formed first and second metal patterns into the semiconductor layer and the barrier layer through a rapid thermal process; and forming the first and second metal patterns, diffused into the semiconductor layer and the barrier layer, as the source electrode and the drain electrode.

\* \* \* \* \*